United States Patent
Masumoto

(10) Patent No.: US 7,089,657 B1
(45) Date of Patent: Aug. 15, 2006

(54) FIXING HOLDER FOR FIXING AN ELECTRONIC COMPONENT HAVING WIRE-SHAPED LEG PORTIONS TO A PRINTED CIRCUIT BOARD

(75) Inventor: Koukichi Masumoto, Osaka (JP)

(73) Assignee: Funai Electric Co., Ltd., Daito (JP)

( * ) Notice: Subject to any disclaimer, the term of this patent is extended or adjusted under 35 U.S.C. 154(b) by 0 days.

(21) Appl. No.: 09/552,713

(22) Filed: Apr. 19, 2000

(30) Foreign Application Priority Data

Apr. 20, 1999 (JP) .............................. P. 11-111877

(51) Int. Cl.
*B23P 19/00* (2006.01)
*H05K 3/30* (2006.01)

(52) U.S. Cl. .......................... 29/741; 29/758; 29/837; 361/740; 361/761; 439/79; 439/84; 439/299; 439/338

(58) Field of Classification Search ................ 29/741, 29/845, 761, 758, 837, 838, 876; 361/740, 361/761, 835, 760, 767, 777; 439/79, 84, 439/299, 338
See application file for complete search history.

(56) References Cited

U.S. PATENT DOCUMENTS 3,179,912 A * 4/1965 Huber et al. ............... 29/837 X
4,399,608 A * 8/1983 Ingaglio ....................... 29/758
5,119,547 A * 6/1992 Ii ................................. 29/764
5,151,034 A * 9/1992 Chandler et al. ............. 439/79
5,707,249 A * 1/1998 Byrd ..................... 361/767 X

FOREIGN PATENT DOCUMENTS

JP  3-113900   11/1991
JP  9-165906  * 6/1997

* cited by examiner

*Primary Examiner*—A. Dexter Tugbang
(74) *Attorney, Agent, or Firm*—Crowell & Moring LLP

(57) ABSTRACT

A fixing holder for fixing an electronic component having wire-shaped leg portions to a printed circuit board, the holder being an almost cylindrical-shaped holder for holding the electronic component having the wire-shaped leg portions in a manner that the leg portions pass through and protrude therefrom, the fixing holder comprises: a holder main body portion for holding a main body portion of the electronic component; and a base portion continuously provided to the holder main body portion, wherein one surface of the base portion on a forward side is opened to form an opening, at least a portion of periphery of the opening is configured to form a flat surface, and a side surface of the holder main body portion on a side where the opening is formed is protruded forward to form an engagement nail portion to be engaged with the printed circuit board.

15 Claims, 3 Drawing Sheets

FIXING HOLDER FOR FIXING AN ELECTRONIC COMPONENT HAVING WIRE-SHAPED LEG PORTIONS TO A PRINTED CIRCUIT BOARD

BACKGROUND OF THE INVENTION

The present invention relates to a fixing holder for fixing an electronic component having wire-shaped leg portions such as an LED (light emitting diode) to a printed circuit board (hereinafter abbreviated as a PCB), and a fixing method utilizing the same.

A PCB is installed in a dipping machine in a state that a multiplicity of electronic components are mounted on the upper portion of the PCB, so that the lower surface thereof soldered.

In general the dipping machine includes guide rails G having U shaped configuration in its section for guiding right and left edges of the PCB as shown in FIG. 1C. The PCB is guided by the guide rails G so as to move therealong and passes through a soldering bath provided on a way of the running path, thereby being subjected to the soldering on its lower surface.

Due to the aforesaid configuration of the dipping machine, an electronic component can not be fixed at the left or right edge of the PCB so as to extend across the edge portion transversely.

In other words, such a component which interferes the passing of the guide rails can not be fixed at the edge portion of the PCB where the guide rail G passes.

In a case where electronic components such as an LED are required to be fixed at the edge portion of such a PCB by all means due to the requirement for the circuit design, only such components are soldered and fixed manually without using the dipping machine.

That is, components other than such particular components are soldered and fixed on the PCB by using the dipping machine and only the particular components are soldered and fixed manually.

The Japanese Utility Model Application Publication No. Hei 3-113900 discloses an LED holder. As shown in FIG. 3, such an LED holder is arranged in a manner that first elastic engagement pieces 101*d*, 102*e* for provisional fixing are protrusively provided at the lower end thereof, second elastic engagement pieces 101*f*, 101*g* for formal fixing are protrusively provided at the one side thereof, and a thin bending portion 101*a* is provided between the first elastic engagement pieces and the second elastic engagement pieces, whereby after the holder is provisionally fixed on a substrate 103, the holder is bent and fixed at a predetermined position of the substrate.

However, when the LED holder 101 is bent at the bending portion 101*a*, tension force is applied at leg portions 102*a*, 102*b* of the LED 102. Thus, there arises a problem that the dipped or soldered portions at the tip ends of the leg portions 102*a*, 102*b* may come off or the leg portions 102*a*, 102*b* may be broken at portions thereof.

Further, according to such a holder, the LED 102 can not protrude to the side direction at the near portion of the edge of the PCB, and the LED is fixed at the portion lifted from the PCB 103 by the length l of the elastic engagement pieces 101*f*, 101*g*. Thus, the holder is insufficient for the degree of freedom in its design.

SUMMARY OF THE INVENTION

Accordingly, an object of the present invention is to provide a holder which can install a PCB in a dipping machine by using the holder even in a case where an electronic component such as an LED must be fixed at the edge of the PCB so that the electronic component can be fixed on the PCB with minimum manual processing.

Further, another object of the present invention is to provide a method for fixing an electronic component having wire-shaped leg portions to a PCB with a fixing holder, the fixing holder being an almost cylindrical-shaped holder for holding the electronic component having the wire-shaped leg portions in a manner that the leg portions pass through and protrude therefrom, the method comprising the steps of: providing a fixing holder on the PCB; holding a main body portion of the electronic component by a holder main body portion of the fixing holder; laying down the holder main body portion towards an opened surface of a base portion thereof; and engaging an engagement nail portion formed on the main body portion of the fixing holder with the PCB.

BRIEF DESCRIPTION OF THE DRAWINGS

FIGS. 1A and 1B show an LED holder according to an embodiment of the present invention, wherein FIG. 1A is an exploded perspective view of the LED holder showing a case where the LED holder is attached to a PCB in an erected state before dipping the PCB, and FIG. 1B is a perspective view showing a state where the LED holder is inclined and laid on the PCB and fixed thereon after dipping the PCB.

FIGS. 3A to 3C show a conventional LED holder, wherein FIG. 3A is a perspective view showing a state where the holder has not been attached yet, FIG. 3B is a cross sectional view showing a state where the holder is provisionally attached and FIG. 3C is a perspective view showing a state where the holder has not been attached.

DETAILED DESCRIPTION OF THE PREFERRED EMBODIMENTS

An LED holder according to the embodiment of the present invention will be explained with reference to the accompanying drawings.

Figure 1A:
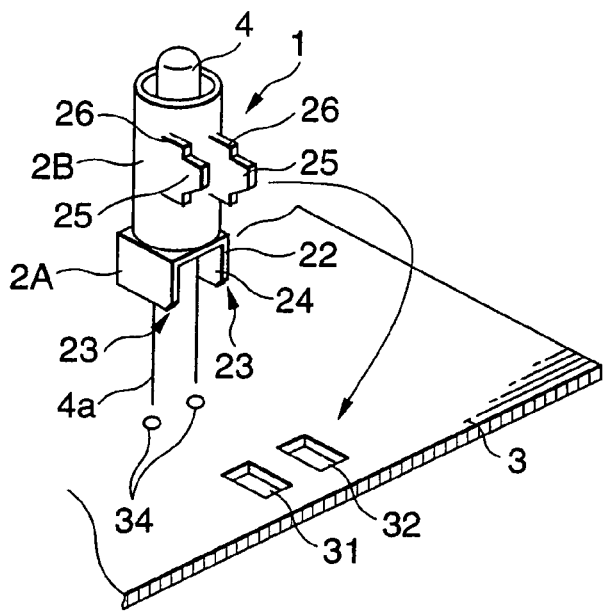
Figure 1C:
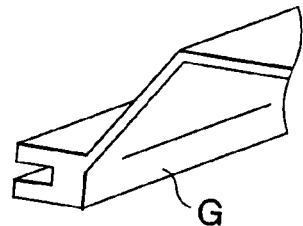
FIG. 1C is a partial perspective view of a guide rail for a dipping machine, the guide rail having a U-shaped cross-section.
Figure 1B:
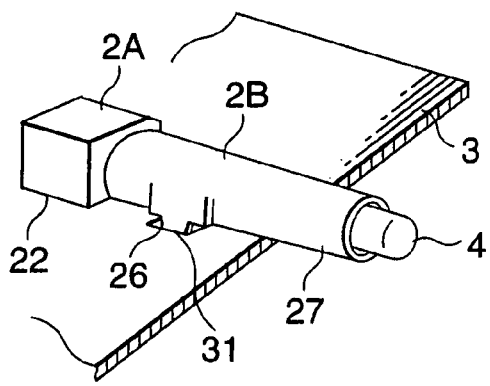
Figure 2A:
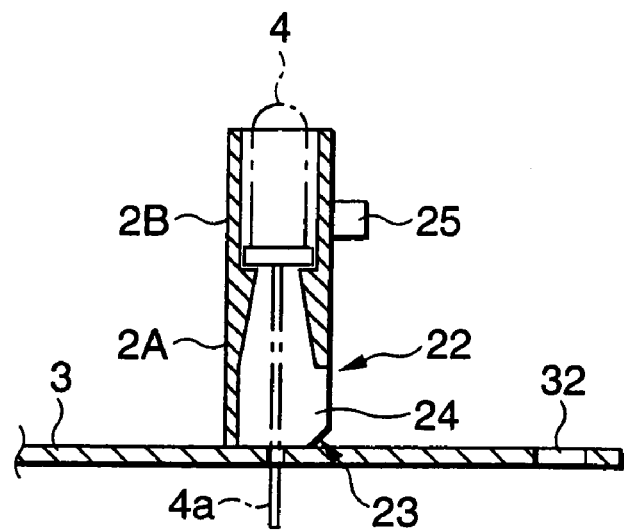
FIGS. 2A and 2B show sectional views of the LED holders showing the states of FIGS. 1A and 1B, respectively.
Figure 2B:
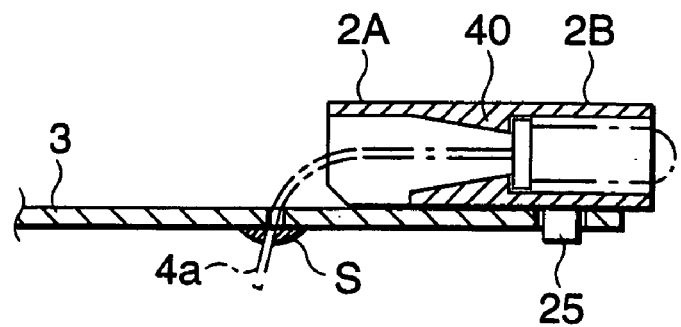
Figure 3A:
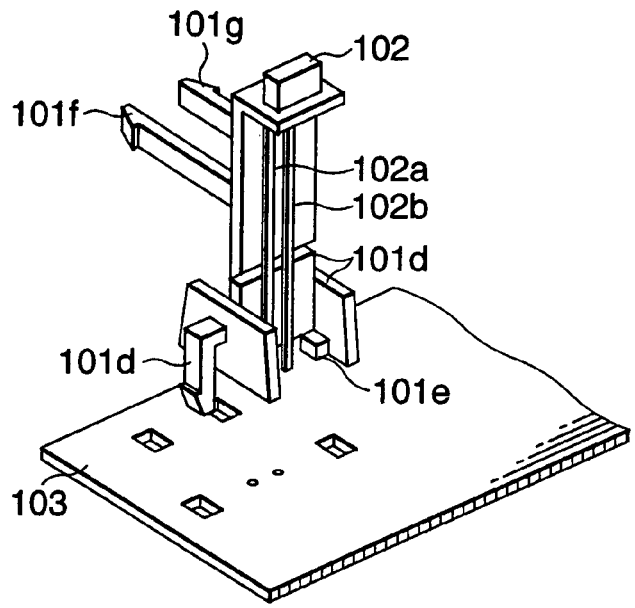
Figure 3B:
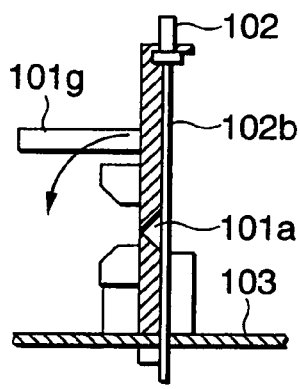
Figure 3C:
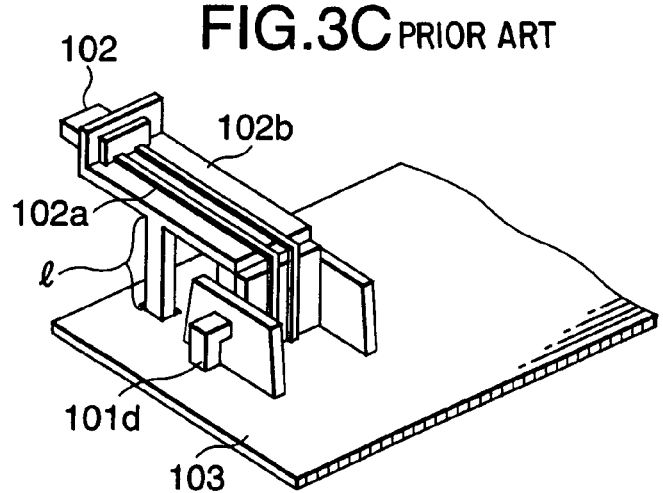

FIGS. 1A and 1B show the LED holder according to the embodiment of the invention, wherein FIG. 1A is an exploded perspective view of the LED holder showing a case where the LED holder is attached to a PCB in an erected state before dipping the PCB, and FIG. 1B is a perspective view showing a state where the LED holder is inclined and laid on the PCB and fixed thereon after dipping the PCB. FIGS. 2A and 2B show sectional views of the LED holders showing the states of FIGS. 1A and 1B, respectively.

As shown in FIGS. 1A and 2A, the LED holder of the embodiment is arranged in a manner that the front surface 22 of a base portion 2A is formed as a flat surface, the front surface 22 is provided at the end portions thereof on the PCB 3 side with slanted surfaces 23, 23 cut obliquely, and an opening 24 is formed at the front surface 22.

The main body portion 2B continuously provided at the base portion 2A is provided at the front surface side of the almost center portion thereof with engagement projection portions 26, having engagement nail potions 25, which are inserted into and engaged with engagement holes 31, 32 provided at predetermined portions of the PCB 3, respectively.

After an LED 4 is inserted into the LED holder 1 configured in this manner, the entirety of the PCB 3 is installed in the dipping machine in a state that the base portion 2A and the main body portion 2B are erected on the PCB 3 as shown in FIG. 1A. Thereafter, the LED holder is attached to the PCB 3 in the following manner as shown in FIGS. 1B and 2B. That is, the main body portion 2B is inclined forward and laid down on the PCB in a manner that the slanted surfaces 23, 23 of the front surface 22 of the base portion 2A are inclined and laid along the upper surface of the PCB 3 thereby to contact the front surface 22 formed by the flat surface to the upper surface. Further, the engagement projection portions 26 are inserted into and engaged with the engagement holes 31, 32 of the PCB 3 so that the engagement nail portions 25 prevent the engagement projection portions 26 from coming out of the engagement holes 31, 32, respectively, whereby both the tip portion 27 of the main body portion 2B and the LED 4 protruding from the tip portion 27 protrude from the edge of the PCB 3.

In the drawings, a reference numeral 4a depicts a wire-shaped leg portion of the LED, and 34 a hole formed in the PCB 3 through which the leg portion 4a is inserted.

Thus, in the case of installing the LED holder in the dipping machine, the LED holder 1 can be approached to the guide rails G in such a state that the holder is erected on the PCB 3. Thus, the LED 4 or the holder 1 can be prevented from striking with the guide rails G of the dipping machine. Further, after passing through the dipping machine, an operator can lay down the LED holder 1 sidewise thereby to protrude the LED 4 or the tip portion 27 of the holder 1 from the edge of the PCB 3.

Accordingly, it is possible to eliminate a process of manually soldering the LED 4 and so the number of the processes can be reduced.

Further, since the holder is configured in a manner that the slanted surfaces 23, 23 cut obliquely are formed at the PCB 3 side end portions of the front surface 22 of the base portion 2A so that the holder is inclined and laid down along the slanted surfaces 23, 23 when being inclined and laid down, the holder can be inclined and laid down smoothly.

Further, since the base portion 2A is provided at the front surface thereof with the opening 24, the leg portions 4a, 4a of the LED 4 can freely move within the opening 24 when the holder is inclined and laid down, so that it is possible to prevent the leg portions 4a, 4a of the LED 4 from being folded or cut.

In the drawings, a symbol S depicts a soldered portion soldered by the dipping machine and a reference numeral 40 depicts a rib formed within the main body portion 2B for pivotally supporting the head portion (light emitting portion) of the LED.

Regarding the holder, the material of the holder is selected from ABS, or PS, the diameter is 3.5 mm, the height is 20 to 25 mm.

In the above embodiment, the holder holds one LED. However, it is possible to hold twin LEDs.

What is claimed is:

1. A fixing holder for fixing an electronic component having wire-shaped leg portions to a printed circuit board, comprising:
a holder adapted to hold the electronic component, the holder having a longitudinal direction in which the holder is substantially closed and hollow with a top opening at one longitudinal end and a bottom opening at the other longitudinal end such that the electronic component is capable of protruding from the top opening and the wire-shaped leg portions are capable of passing through and protruding from the bottom opening, said holder further comprising:

a substantially cylindrical holder main body portion adapted to hold a main body portion of the electronic component; and a base portion extending beyond the holder main body portion in the longitudinal direction from one longitudinal end of said holder main body portion, wherein one surface of said base portion on a forward side is opened to form a side opening, at least a portion of a periphery of the forward side opening being configured to form a flat surface, and a side surface of said holder main body portion on a side where the forward side opening is formed includes a projection protruding forward and adapted to engage with the printed circuit board.

2. The fixing holder for fixing the electronic component having the wire-shaped leg portions to the printed circuit board according to claim 1, wherein a slanted surface is formed at a lower end portion of the flat surface in the longitudinal direction of the holder whereby the flat surface is adapted to contact an upper surface of the printed circuit board when inclined forward to lay down the fixing holder.

3. The fixing holder for fixing the electronic component having the wire-shaped leg portions to the printed circuit board according to claim 1, wherein the forward side opening in the base portion is dimensioned such that, when said holder main body portion is inclined forward, the wire-shaped leg portions are capable of moving freely within the forward side opening.

4. The fixing holder according to claim 1, wherein the projection protrudes substantially orthogonally with respect to the longitudinal direction of the holder.

5. The fixing holder according to claim 4, wherein the projection further comprises an engagement nail extending orthogonally to the projection at a free end thereof.

6. The fixing holder according to claim 1, wherein the base portion includes the bottom opening in the longitudinal direction of the holder and is closed on lateral sides of the bottom opening except for the forward side opening.

7. An assembly, comprising:

a printed circuit board;

an electronic component having wire-shaped leg portions;

a fixing holder for fixing the electronic component having the wire-shaped leg portions to the printed circuit board, the holder having a longitudinal direction in which the holder is substantially closed and hollow with a top opening at one longitudinal end and a bottom opening at the other longitudinal end such that the electric component is arranged in an area of the top opening and the wire-shaped leg portions protrude from the bottom opening;

wherein said fixing holder further comprises:

a holder main body portion adapted to hold a main body portion of the electronic component; and a base portion extending in the longitudinal direction from said holder main body portion, wherein one surface of said base portion on a forward side is opened to form a side opening, at least a portion of a periphery of the forward side opening being configured to form a flat surface, and a side surface of said holder main body portion on a side where the forward side opening is formed includes a projection protruding forward and engaging with the printed circuit board.

8. The assembly according to claim 7, wherein the leg portions protruding from the bottom opening are passed through holes formed at the printed circuit board and dipped in that state, thereafter said holder main body portion is inclined forward and laid down on the printed circuit board such that the flat surface is made in contact with an upper surface of the printed circuit board, and said projection is inserted into and engaged with an engagement hole formed at the printed circuit board to fix said holder to the printed circuit board.

9. The assembly according to claim 8, wherein a slanted surface is formed at a lower end portion of the flat surface in the longitudinal direction of the holder so that, when the holder main body portion is inclined forward and laid down, the slanted surface contacts the upper surface of the printed circuit board to facilitate inclining and laying down the holder.

10. The assembly according to claim 8, wherein the lateral side opening is arranged in a manner that, when said holder main body portion is inclined forward, the wire-shaped leg portions move freely within the opening.

11. The assembly holder according to claim 8, wherein the projection protrudes substantially orthogonally with respect to the longitudinal direction of the holder.

12. The assembly holder according to claim 8, wherein the projection further comprises an engagement nail extending orthogonally to the projection at a free end thereof.

13. The assembly according to claim 7, wherein the base portion includes the bottom opening in the longitudinal direction of the holder and is closed on lateral sides of the bottom opening except for the forward side opening.

14. A fixing holder for fixing an electronic component having wire-shaped leg portions to a printed circuit board, comprising:

said holder being an almost cylindrical-shaped holder adapted to hold the electronic component, the holder having a longitudinal direction in which the holder is substantially closed and hollow with a top opening at one longitudinal end and a bottom opening at the other longitudinal end such that the electronic component is capable of protruding from the top opening and the wire-shaped leg portions are capable of passing through and protruding from the bottom opening, said fixing holder further comprising:

a holder main body portion adapted to hold a main body portion of the electronic component; and a base portion extending in the longitudinal direction from said holder main body portion, wherein one surface of said base portion on a forward side is opened to form a side opening, at least a portion of a periphery of the forward side opening being configured to form a flat surface, a side surface of said holder main body portion on a side where the forward side opening is formed includes a projection protruding forward and engaging with the printed circuit board, a slanted surface is formed at a lower end portion of the flat surface in the longitudinal direction of the holder whereby the flat surface is adapted to contact an upper surface of the printed circuit board when inclined forward to lay down the fixing holder, and wherein the base portion includes the bottom opening in the longitudinal direction of the holder and is closed on lateral sides of the bottom opening except for the forward side opening.

15. An assembly, comprising:

a printed circuit board;

an electronic component having wire-shaped leg portions;

a fixing holder for fixing the electronic component having the wire-shaped leg portions to the printed circuit board, the holder having a hollow substantially cylindrical shape in a longitudinal direction with top and bottom openings such that the electric component is arranged in an area of the top opening and the wire-shaped leg portions protrude from the bottom opening;

wherein said fixing holder further comprises:

a holder main body portion adapted to hold a main body portion of the electronic component; and a base portion extending in the longitudinal direction from said holder main body portion, wherein one surface of said base portion on a forward side is opened to form a side opening, at least a portion of a periphery of the forward side opening being configured to form a flat surface, and a side surface of said holder main body portion on a side where the forward side opening is formed includes a projection protruding forward and adapted to engage with the printed circuit board, wherein the leg portions protruding from the bottom opening are passed through holes formed at the printed circuit board and dipped in that state, thereafter said holder main body portion is inclined forward and laid down on the printed circuit board such that the flat surface is made in contact with an upper surface of the printed circuit board, and said projection is inserted into and engaged with an engagement hole formed at the printed circuit board to fix said holder to the printed circuit board, wherein a slanted surface is formed at a lower end portion of the flat surface in the longitudinal direction of the holder so that, when the holder main body portion is inclined forward and laid down, the slanted surface contacts the upper surface of the printed circuit board to facilitate inclining and laying down the holder, and wherein the base portion includes the bottom opening in the longitudinal direction of the holder and is closed on lateral sides of the bottom opening except for the forward side opening.

* * * * *